(12) United States Patent
Lai et al.

(10) Patent No.: US 11,477,900 B2
(45) Date of Patent: Oct. 18, 2022

(54) LOCKING ASSEMBLY AND ENCLOSURE USING THE SAME

(71) Applicant: HONG FU JIN PRECISION INDUSTRY (WuHan) CO., LTD., Wuhan (CN)

(72) Inventors: Tzu-Wei Lai, New Taipei (TW); Hao-Chun Huang, New Taipei (TW); Wen-Hsiang Hung, New Taipei (TW); Jun-Bo Yang, Wuhan (CN)

(73) Assignee: HONG FU JIN PRECISION INDUSTRY (WuHan) CO., LTD., Wuhan (CN)

( * ) Notice: Subject to any disclaimer, the term of this patent is extended or adjusted under 35 U.S.C. 154(b) by 295 days.

(21) Appl. No.: 16/907,506

(22) Filed: Jun. 22, 2020

(65) Prior Publication Data
US 2021/0207406 A1  Jul. 8, 2021

Related U.S. Application Data

(63) Continuation-in-part of application No. PCT/CN2020/070936, filed on Jan. 8, 2020.

(51) Int. Cl.
*H05K 5/02* (2006.01)
*E05B 67/38* (2006.01)
(Continued)

(52) U.S. Cl.
CPC ......... *H05K 5/0221* (2013.01); *E05B 65/006* (2013.01); *E05B 67/383* (2013.01); *G06F 1/181* (2013.01); *H05K 5/03* (2013.01)

(58) Field of Classification Search
CPC .. E05B 67/383; E05B 65/006; E05B 65/0067; E05B 73/0082; E05B 67/02;
(Continued)

(56) References Cited

U.S. PATENT DOCUMENTS 4,761,975 A * 8/1988 Kachnowski ........... G06F 1/181
70/DIG. 57
5,732,000 A * 3/1998 Chiesi ..................... G06F 1/181
361/679.57
(Continued)

FOREIGN PATENT DOCUMENTS

CN       2445362 Y  *  8/2001
CN       2445362 Y      8/2001
(Continued)

*Primary Examiner* — Nidhi Thaker
(74) *Attorney, Agent, or Firm* — ScienBiziP, P.C.

(57) ABSTRACT

A locking assembly for a Kensington-locked enclosure can be simply padlocked for security. The locking assembly includes a first connecting member and a second connecting member. The first connecting member is fixed on a base body of the enclosure, the first connecting member comprises a first tongue piece. The second connecting member is fixed on an upper cover of the enclosure, and the second connecting member comprises a second tongue piece. The first tongue piece and the second tongue piece protrude from an outside of the enclosure and fit each other, and a padlock can pass through the first tongue piece and the second tongue piece to lock the base body and the upper cover together and secure the attachment of the Kensington lock.

14 Claims, 5 Drawing Sheets

(51) Int. Cl.
*H05K 5/03* (2006.01)
*E05B 65/00* (2006.01)
*G06F 1/18* (2006.01)

(58) Field of Classification Search
CPC . E05B 73/0005; Y10T 70/413; H05K 7/1487; H05K 5/0221; H05K 5/03; G06F 1/1679; G06F 1/181
See application file for complete search history.

(56) References Cited

U.S. PATENT DOCUMENTS

| | | | | |
|---|---|---|---|---|
| 5,787,737 | A * | 8/1998 | Cho | E05B 67/383 70/57 |
| 5,816,076 | A * | 10/1998 | Biedermann | E05B 73/0082 70/164 |
| 5,825,626 | A * | 10/1998 | Hulick | G06F 1/181 361/679.48 |
| 5,907,962 | A * | 6/1999 | Smithson | E05B 73/0082 70/164 |
| 6,075,693 | A * | 6/2000 | Leman | H05K 5/0208 292/87 |
| 7,302,816 | B1 * | 12/2007 | Lu | E05B 73/0082 70/49 |
| 8,307,675 | B2 * | 11/2012 | Avganim | E05B 67/36 70/164 |
| 9,655,273 | B2 * | 5/2017 | Zhou | H05K 7/1487 |
| 2005/0146849 | A1 | 7/2005 | Mullen et al. | |
| 2011/0203327 | A1 * | 8/2011 | Fong | E05B 67/383 70/14 |
| 2018/0080261 | A1 * | 3/2018 | Harris | E05B 67/383 |
| 2019/0383070 | A1 * | 12/2019 | Marchl | E05B 65/025 |

FOREIGN PATENT DOCUMENTS

| | | |
|---|---|---|
| CN | 101004123 A | 7/2007 |
| CN | 203746077 U | 7/2014 |
| CN | 106033236 A | 10/2016 |
| EP | 0955433 A1 * | 5/1998 |

* cited by examiner

LOCKING ASSEMBLY AND ENCLOSURE USING THE SAME

FIELD

The subject matter herein generally relates to locking assemblies.

BACKGROUND

To keep the enclosure of an electronic device secure and for hiding electronic components within the device, the base and top cover of an enclosure for electronics should be lockable.

Therefore, improvement is desired.

BRIEF DESCRIPTION OF THE DRAWINGS

Implementations of the present disclosure will now be described, by way of embodiments, with reference to the attached figures.

DETAILED DESCRIPTION

Figure 1:
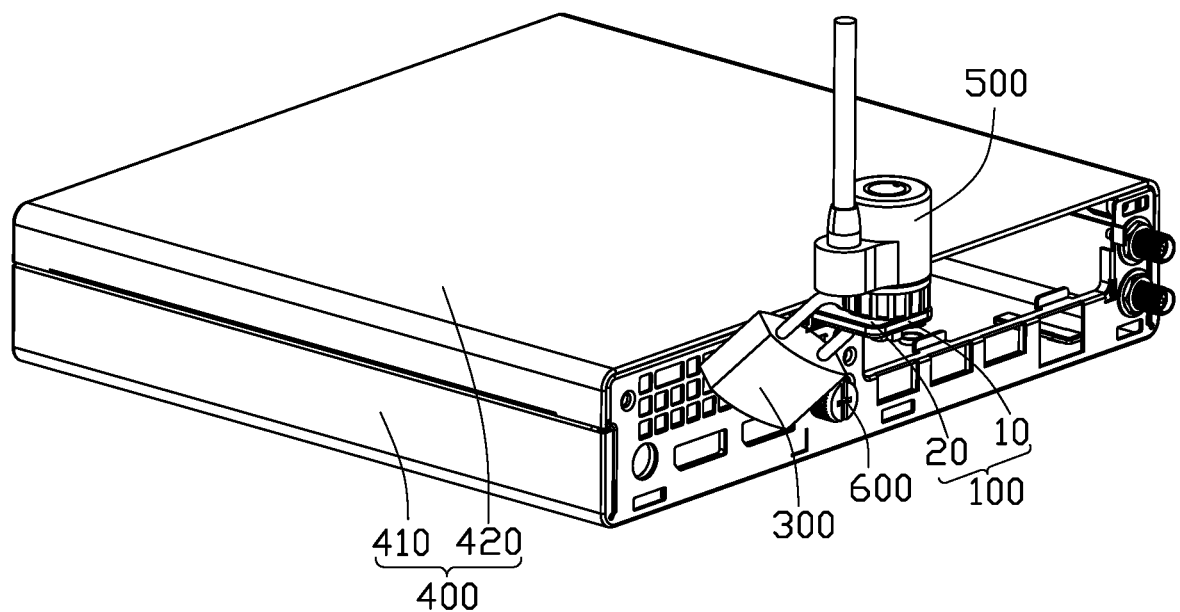
FIG. 1 is a diagram of an assembled and locked enclosure in one embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 2:
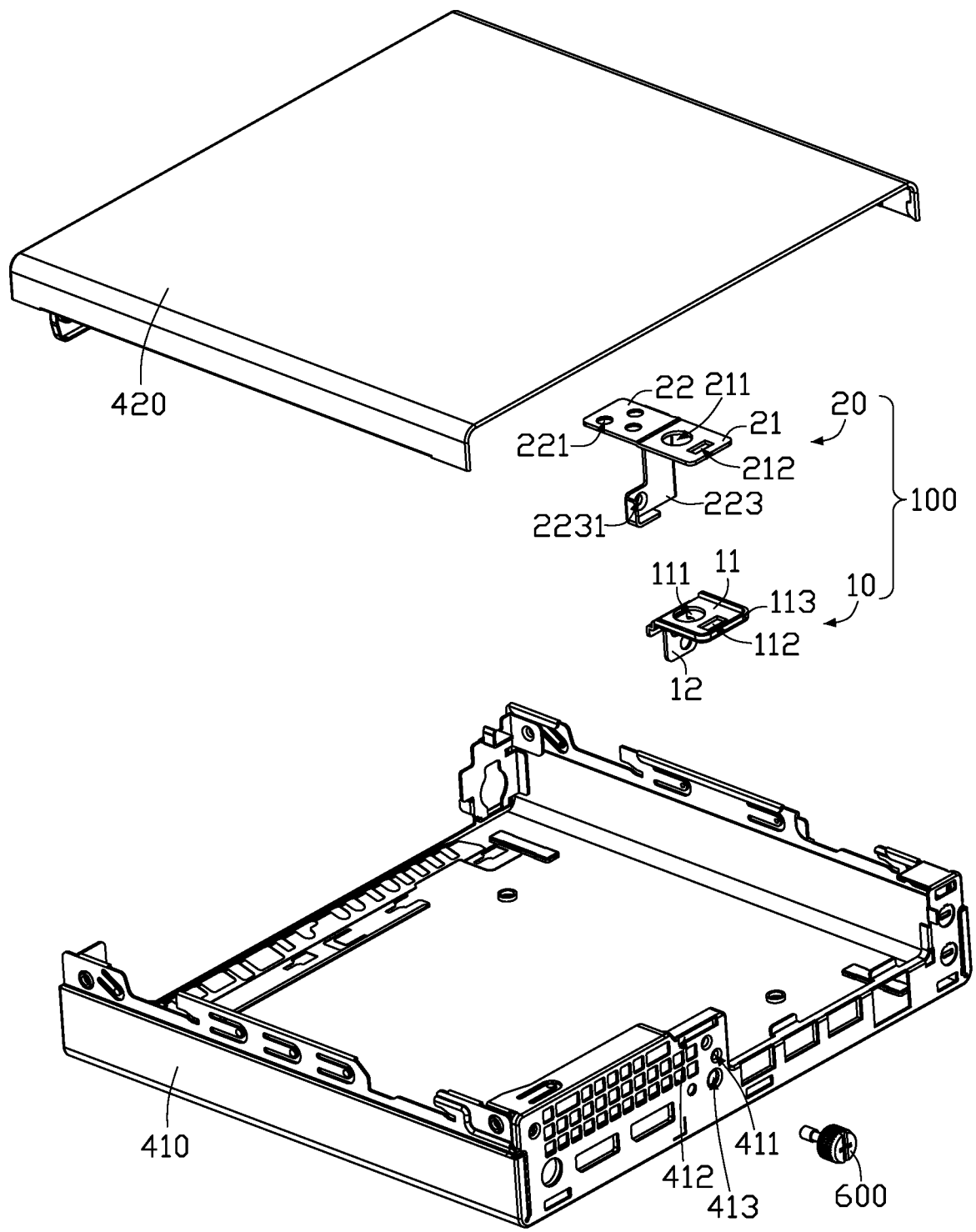
FIG. 2 is an exploded view of the enclosure of FIG. 1.

FIGS. 1 and 2 illustrate a locking assembly 100 in accordance with an embodiment of the present disclosure. In the embodiment, the locking assembly 100 is fixed on an enclosure 400. The enclosure 400 includes a base body 410 and an upper cover 420. The locking assembly 100 cooperates with a padlock 300 to fasten the base body 410 and the upper cover 420 of the enclosure 400.

The locking assembly 100 includes a first connecting member 10 and a second connecting member 20. The first connecting member 10 is fixed on the base body 410, and the second connecting member 20 is fixed on the upper cover 420. The padlock 300 passes through the first connecting member 10 and the second connecting member 20.

Figure 3:
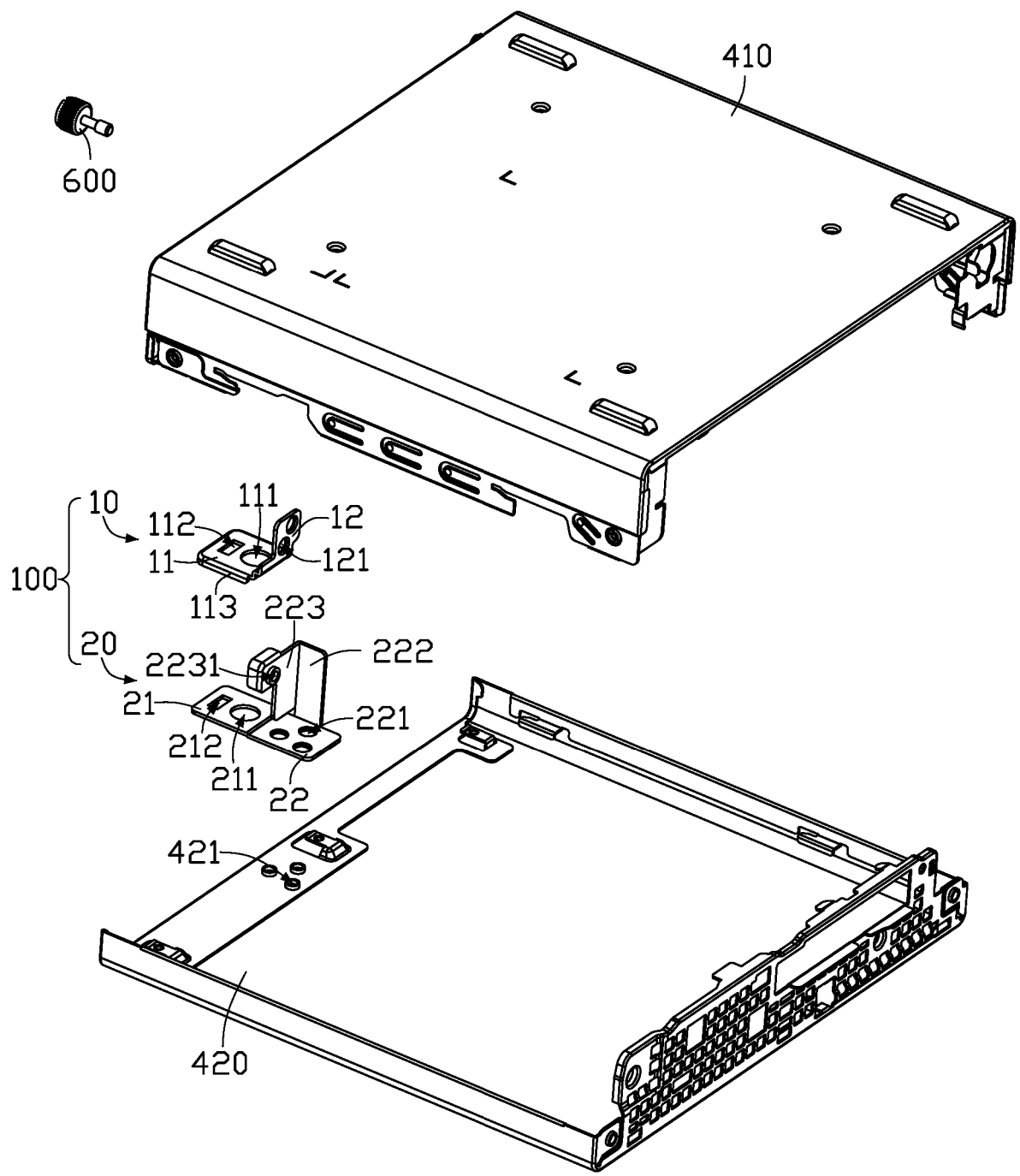
FIG. 3 is an exploded view of the enclosure of FIG. 1 from another perspective.
Figure 4:
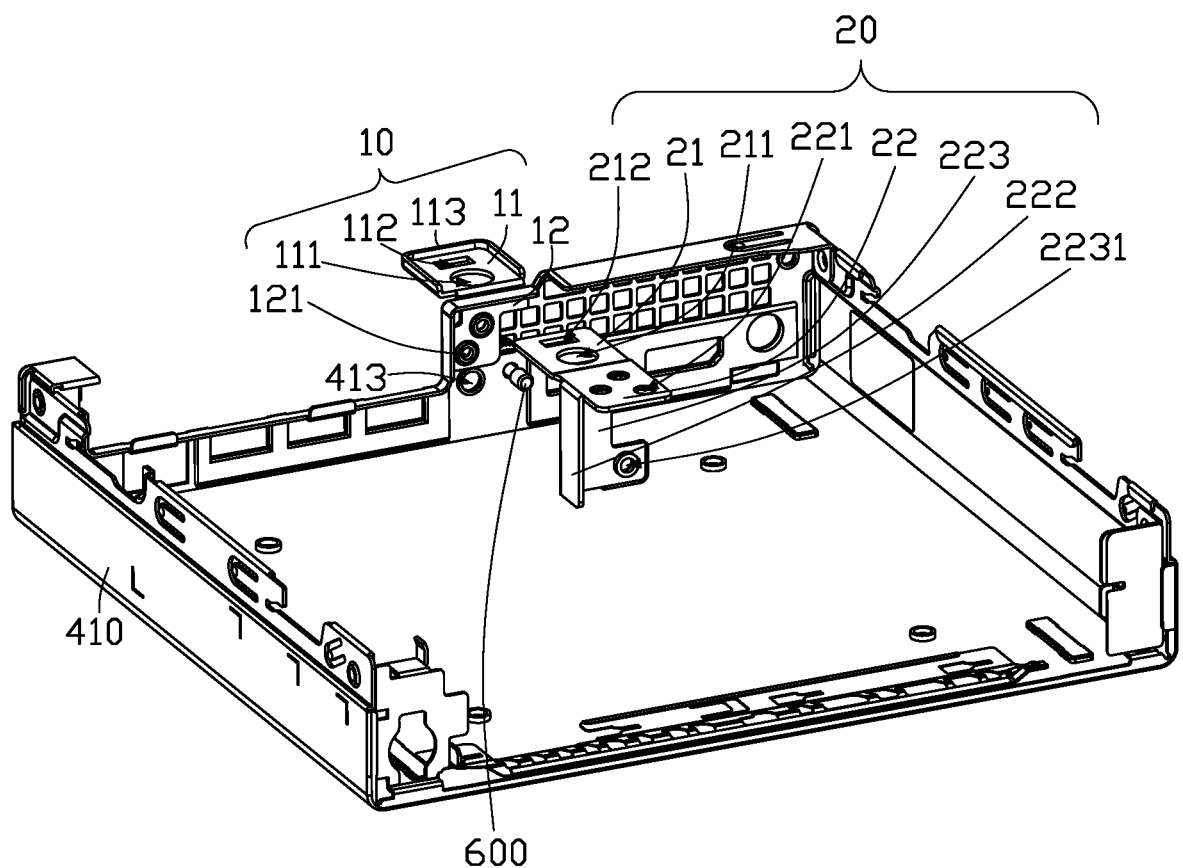
FIG. 4 is a diagram of a first connecting member and a base body of FIG. 1 assembled together.
Figure 5:
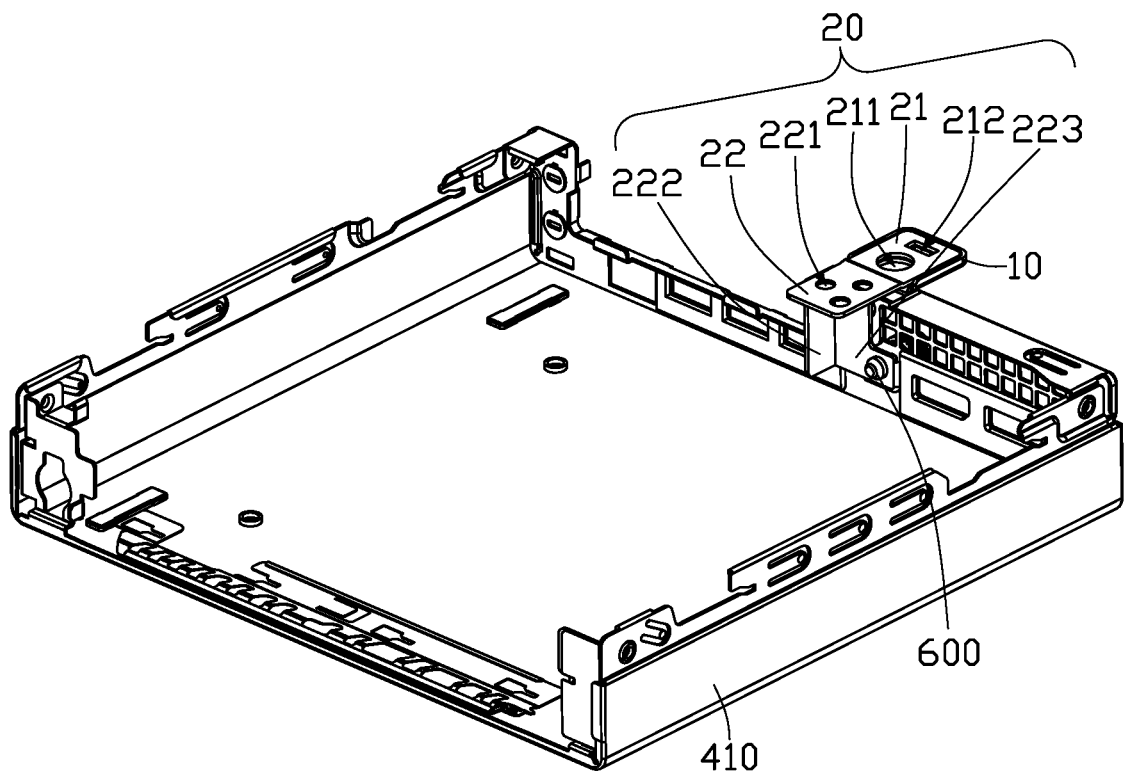
FIG. 5 is a diagram of the first connecting member, the base body, and a second connecting member of FIG. 1 assembled together.

FIGS. 3-5 illustrate that the first connecting member 10 and the second connecting member 20 respectively have a first tongue piece 11 and a second tongue piece 21. The first tongue piece 11 and the second tongue piece 21 protrude from an outside of the enclosure 400 and fit each other. The padlock 300 locks the base body 410 and the upper cover 420 by locking together the first tongue piece 11 and the second tongue piece 21.

The first connecting member 10 includes a first extending module 12. The first extending module 12 is perpendicular to the first tongue piece 11 and disposed inside of a side wall of the base body 410. The first extending module 12 defines two connecting holes 121, and two convex holes 411 (shown in FIG. 2) are defined on the inside of the side wall of the base body 410. A flange of the convex hole 411 can fit into the connecting hole 121 to fix the first connecting member 10 to the base body 410.

The second connecting member 20 includes a second extending module 22. The second extending module 22 defines three fixing holes 221. The upper cover 420 defines three protruding members 421. A flange of the protruding member 421 can fit into the fixing hole 221 to fix the second connecting member 20 to the inside of the upper cover 420.

The side wall of the base body 410 defines a groove 412 (shown in FIG. 2). The width of the groove 412 is the same as the width of the first connecting member 10. The groove 412 receives the first connecting member 10. The first extending module 12 is inserted into the groove 412 to extend into the base body 410. Since the first extending module 12 and the first tongue piece 11 are vertical in structure, the first connecting member 10 cannot be taken out when the base body 410 is covered by the upper cover 420.

The second extending module 22 of the second connecting member 20 extends out into a first folding plate 222 and a second folding plate 223. The first folding plate 222 is a vertical plane and perpendicular to the second extending module 22. The second folding plate 223 is a vertical plane and perpendicular to the first folding plate 222. The second folding plate 223 defines a first through hole 2231. A side wall of the base body 410 defines a second through hole 413. The first through hole 2231 and the second through hole 413 are used for threading a screw bolt 600 to fix the second connecting member 20 to the base body 410, making the second connecting member 20 more stable relative to the first connecting member 10.

The first tongue piece 11 defines a first keyhole 111 and a third keyhole 112, and the second tongue piece 21 defines a second keyhole 211 and a fourth keyhole 212. The first keyhole 111 and the second keyhole 211 are for the padlock 300 to lock together the first connecting member 10 and the second connecting member 20. The third keyhole 112 and the fourth keyhole 212 can accept a Kensington lock 500 (shown in FIG. 1) to keep the pieces of the enclosure 400 together or prevent theft.

In the embodiment, a hoard plate 113 is provided at the edge of the first tongue piece 11. The hoard plate 113 is used to locate the second tongue piece 21 to facilitate accurate alignment of the first keyhole 111 and the second keyhole 211, and the third keyhole 112 and the fourth keyhole 212.

In use, the second extending module 22 of the second connecting member 20 is inserted into the flange of the protruding member 421 through the fixing hole 221 and thereby fix it to the upper cover 420. The first extending module 12 of the first connecting member 10 is inserted into the groove 412 of the base body 410, and the flange of the convex hole 411 of the base body 410 is inserted into the connecting hole 121, to fix the first connecting member 10 to the base body 410. The upper cover 420 is laid on the base body 410, the second folding plate 223 of the second connecting member 20 and the first through hole 2231, the second through hole 413 of the base body 410 are automatically aligned, and the second connecting member 20 is fixed to the base body 410 through the screw bolt 600. The first tongue piece 11 and the second tongue piece 21 fit together and the padlock 300 in the first keyhole 111 and the second keyhole 211 locks the pieces together. The Kensington lock 500 is threaded through the third keyhole 112 and the fourth keyhole 212.

In other embodiments, there may be more connecting holes 121 defined in the first extending module 12, and the side of the base body 410 may define more convex holes 411. Different quantities of the fixing holes 221, and the protruding members 421, may be utilized.

Compared with the related art, the locking assembly 100 can lock the enclosure 400 through the cooperation of the first connecting member 10 and the second connecting member 20 with the padlock 300 and the Kensington lock 500, to foil theft.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the exemplary embodiments described above may be modified within the scope of the claims.

What is claimed is:

1. A locking assembly configured for cooperating with a padlock to fasten an enclosure, the locking assembly comprising: a first connecting member fixed on a base body of the enclosure; wherein the first connecting member comprises a first tongue piece; a second connecting member fixed on an upper cover of the enclosure; wherein the second connecting member comprises a second tongue piece; wherein the first tongue piece and the second tongue piece protrude from an outside of the enclosure and fit each other, and the padlock passes through the first tongue piece and the second tongue piece to lock the base body and the upper cover, wherein the second connecting member comprises a second extending module, the second extending module defines a plurality of fixing holes, the upper cover defines a plurality of protruding members, and a flange of each of the plurality of protruding members is inserted into one of the plurality of fixing holes to fix the second connecting member to inside of the upper cover, and wherein the second extending module of the second connecting member extends out into a first folding plate and a second folding plate, the first folding plate is a vertical plane and perpendicular to the second extending module, the second folding plate is a vertical plane and perpendicular to the first folding plate, and wherein the second folding plate defines a first through hole, a side wall of the base body defines a second through hole, and a screw bolt passes through the first through hole and the second through hole to fix the second connecting member to the base body.

2. The locking assembly according to claim 1, wherein the first connecting member comprises a first extending module, and the first extending module is perpendicular to the first tongue piece and disposed inside of the side wall of the base body.

3. The locking assembly according to claim 2, wherein the first extending module defines a plurality of connecting holes, and inside of the side wall of the base body defines a plurality of convex holes, and a flange of each of the plurality of convex holes is inserted into one of the plurality of connecting holes to fix the first connecting member to the base body.

4. The locking assembly according to claim 2, wherein the side wall of the base body defines a groove, the first extending module is inserted into the groove to extend into the base body.

5. The locking assembly according to claim 4, wherein a width of the groove is the same as a width of the first connecting member.

6. The locking assembly according to claim 1, wherein the first tongue piece defines a first keyhole, the second tongue piece defines a second keyhole, and the padlock passes through the first keyhole and the second keyhole to lock the first connecting member and the second connecting member.

7. The locking assembly according to claim 6, wherein a hoard plate is provided at an edge of the first tongue piece, the hoard plate is used to limit the second tongue piece, to facilitate accurate alignment of the first keyhole and the second keyhole.

8. An enclosure comprising: a base body; an upper cover; a locking assembly locking the base body and the upper cover and comprising; a first connecting member fixed on the base body of the enclosure; wherein the first connecting member comprises a first tongue piece; a second connecting member fixed on the upper cover of the enclosure; wherein the second connecting member comprises a second tongue piece; wherein the first tongue piece and the second tongue piece protrude from an outside of the enclosure and fit each other, and a padlock passes through the first tongue piece and the second tongue piece to lock the base body and the upper cover, wherein the second connecting member comprises a second extending module, the second extending module defines a plurality of fixing holes, the upper cover defines plurality of protruding members, and a flange of the protruding member is inserted into the fixing hole to fix the second connecting member to inside of the upper cover, wherein the second extending module of the second connecting member extends out into a first folding plate and a second folding plate, the first folding plate is a vertical plane and perpendicular to the second extending module, the second folding plate is a vertical plane and perpendicular to the first folding plate, and wherein the second folding plate defines a first through hole, a side wall of the base body defines a second through hole, and a screw bolt passes through the first through hole and the second through hole to fix the second connecting member to the base body.

9. The enclosure according to claim 8, wherein the first connecting member comprises a first extending module, and the first extending module is perpendicular to the first tongue piece and disposed inside of the side wall of the base body.

10. The enclosure according to claim 9, wherein the first extending module defines a plurality of connecting holes, and inside of the side wall of the base body defines a plurality of convex holes, and a flange of the convex hole is inserted into the connecting hole to fix the first connecting member to the base body.

11. The enclosure according to claim 9, wherein the side wall of the base body defines a groove, the first extending module is inserted into the groove to extend into the base body.

12. The enclosure according to claim 11, wherein a width of the groove is the same as a width of the first connecting member.

13. The enclosure according to claim 8, wherein the first tongue piece defines a first keyhole, the second tongue piece defines a second keyhole, and the padlock passes through the first keyhole and the second keyhole to lock the first connecting member and the second connecting member.

14. The enclosure according to claim 13, wherein a hoard plate is provided at an edge of the first tongue piece, the hoard plate is used to limit the second tongue piece, to facilitate accurate alignment of the first keyhole and the second keyhole.

* * * * *